United States Patent
Heinonen

(10) Patent No.: US 10,109,074 B2
(45) Date of Patent: Oct. 23, 2018

(54) METHOD AND SYSTEM FOR INERTIAL MEASUREMENT HAVING IMAGE PROCESSING UNIT FOR DETERMINING AT LEAST ONE PARAMETER ASSOCIATED WITH AT LEAST ONE FEATURE IN CONSECUTIVE IMAGES

(71) Applicant: Sharper Shape Oy, Espoo (FI)

(72) Inventor: Tero Heinonen, Järvenpää (FI)

(73) Assignee: Sharper Shape Oy, Espoo (FI)

( * ) Notice: Subject to any disclaimer, the term of this patent is extended or adjusted under 35 U.S.C. 154(b) by 122 days.

(21) Appl. No.: 15/405,356

(22) Filed: Jan. 13, 2017

(65) Prior Publication Data

US 2017/0132808 A1   May 11, 2017

Related U.S. Application Data

(63) Continuation-in-part of application No. 14/666,762, filed on Mar. 24, 2015, now Pat. No. 9,574,936.

(51) Int. Cl.

| | |
|---|---|
| *H04N 5/232* | (2006.01) |
| *G06T 7/00* | (2017.01) |
| *G06T 7/60* | (2017.01) |
| *G06T 7/73* | (2017.01) |
| *G01C 21/16* | (2006.01) |
| *G01J 1/44* | (2006.01) |
| *G01S 17/02* | (2006.01) |
| *G01S 17/10* | (2006.01) |
| *G01S 17/89* | (2006.01) |
| *G01S 7/48* | (2006.01) |

(Continued)

(52) U.S. Cl.
CPC .............. *G06T 7/97* (2017.01); *G01C 21/165* (2013.01); *G01J 1/44* (2013.01); *G01S 7/4808* (2013.01); *G01S 7/4863* (2013.01); *G01S 17/023* (2013.01); *G01S 17/107* (2013.01); *G01S 17/89* (2013.01); *G06T 7/60* (2013.01); *G06T 7/73* (2017.01); *H01L 27/14609* (2013.01); *G06T 2207/10004* (2013.01)

(58) Field of Classification Search
CPC ........... H04N 5/23219; H04N 5/23238; H04N 5/335; G06T 17/00; G06T 7/55; G06T 7/60; G06T 7/73; G06T 5/001; G06T 7/97; G06K 9/00234; G01C 21/165
USPC ....................................... 250/208.1
See application file for complete search history.

(56) References Cited

U.S. PATENT DOCUMENTS 5,870,486 A * 2/1999 Choate ................ G01C 21/005
                                                        382/103

* cited by examiner

*Primary Examiner* — Que T Le
(74) *Attorney, Agent, or Firm* — Ziegler IP Law Group, LLC

(57) ABSTRACT

A method and a system for inertial measurement. The method includes controlling at least one imaging sensor to capture at least two consecutive images, processing the at least two consecutive images to identify at least one feature therein and determining at least one parameter associated with the at least one feature, and determining a change in a position and an orientation of the at least one imaging sensor, based upon the at least one parameter associated with the at least one feature. The at least one parameter includes at least one of: a presence or absence of the at least one feature in at least one of the at least two consecutive images, respective pixel locations of the at least one feature in the at least two consecutive images, and/or three-dimensional locations of the at least one feature with respect to the at least one imaging sensor.

17 Claims, 2 Drawing Sheets

(51) Int. Cl.
    *G01S 7/486*     (2006.01)
    *H01L 27/146*     (2006.01)

METHOD AND SYSTEM FOR INERTIAL MEASUREMENT HAVING IMAGE PROCESSING UNIT FOR DETERMINING AT LEAST ONE PARAMETER ASSOCIATED WITH AT LEAST ONE FEATURE IN CONSECUTIVE IMAGES

CROSS-REFERENCE TO RELATED APPLICATIONS

This application is a continuation-in-part of U.S. patent application Ser. No. 14/666,762, titled "PLANAR IMAGING SENSOR" and filed on Mar. 24, 2015, the disclosure of which is incorporated herein by reference in its entirety.

TECHNICAL FIELD

The present disclosure relates generally to vehicle navigation systems; and more specifically, to methods and systems for inertial measurement.

BACKGROUND

In recent times, there have been rapid advancements in techniques for tracking (or monitoring) movements of vehicles such as cars, ships, aeroplanes, and so forth. Further, tracking the movements of vehicles is of critical importance for semi-autonomous and autonomous vehicles to avoid operational errors and accidents.

Typically, inertial navigation systems include inertial measurement units for tracking the movements of vehicles. For example, the inertial measurement units include motion sensors such as accelerometers, gyroscopes, and so forth, to determine the movements of vehicles. However, simple and low-cost inertial measurement units suffer from a number of drawbacks such as offset errors (namely, offset errors while inertial measurement unit is subject to invariant conditions, and repeatability offset errors where the inertial measurement unit is subject to variant conditions between similar conditions), scale factor errors (namely, errors on first order sensitivity of the inertial measurement unit due to non-repeatability and non-linearity), misalignment errors (namely, errors due to imperfect mechanical mounting of the inertial measurement unit on vehicles), cross axis sensitivity (namely, errors due to parasitic measurement induced in the inertial measurement unit by solicitation along an axis orthogonal to axes of the motion sensors), noise (namely, errors during use of the inertial measurement unit within an environment), and environment sensitivity (namely, errors due to sensitivity of the inertial measurement unit to thermal gradients and/or wind/water currents within the environment).

Therefore, nowadays, high-performance inertial measurement units are being used in vehicles to overcome the drawbacks of the simple and low-cost inertial measurement units. However, the high-performance inertial measurement units also have certain limitations associated with use thereof. Examples of such limitations include, heavy weight of the high-performance inertial measurement units, high cost of the high-performance inertial measurement units, and so forth. For example, weight of a high performance inertial measurement unit may be approximately 1 kilogram. Specifically, the high-performance inertial measurement units consume a large amount of energy from the vehicles due to the heavy weight, and may also reduce payload weight capacity for vehicles such as unmanned aerial vehicles.

Therefore, in light of the foregoing discussion, there exists a need to overcome the aforementioned drawbacks associated with contemporary inertial navigation systems.

SUMMARY

The present disclosure seeks to provide a method for inertial measurement. The present disclosure also seeks to provide a system for inertial measurement. The present disclosure seeks to provide a solution to the existing problem of heavy weight and high cost of high-performance inertial measurement units. An aim of the present disclosure is to provide a solution that overcomes at least partially the problems encountered in prior art, and provides a lost cost, reliable, and accurate solution for inertial measurement.

In one aspect, an embodiment of the present disclosure provides a method for inertial measurement, the method comprising:

(a) controlling at least one imaging sensor to capture at least two consecutive images;

(b) processing the at least two consecutive images to identify at least one feature therein and to determine at least one parameter associated with the at least one feature, wherein the at least one parameter comprises at least one of: a presence or absence of the at least one feature in at least one of the at least two consecutive images, respective pixel locations of the at least one feature in the at least two consecutive images, and/or three-dimensional locations of the at least one feature with respect to the at least one imaging sensor; and (c) determining a change in a position and an orientation of the at least one imaging sensor, based upon the at least one parameter associated with the at least one feature.

In another aspect, an embodiment of the present disclosure provides a system for inertial measurement, the system comprising:

(i) at least one imaging sensor; and (ii) at least one image processing unit coupled to the at least one imaging sensor, wherein the at least one image processing unit is configured to:

(a) control the at least one imaging sensor to capture at least two consecutive images;

(b) process the at least two consecutive images to identify at least one feature therein and to determine at least one parameter associated with the at least one feature, wherein the at least one parameter comprises at least one of: a presence or absence of the at least one feature in at least one of the at least two consecutive images, respective pixel locations of the at least one feature in the at least two consecutive images, and/or three-dimensional locations of the at least one feature with respect to the at least one imaging sensor; and (c) determine a change in a position and an orientation of the at least one imaging sensor, based upon the at least one parameter associated with the at least one feature.

Embodiments of the present disclosure substantially eliminate or at least partially address the aforementioned problems in the prior art, and enables reliable and accurate inertial measurement.

Additional aspects, advantages, features and objects of the present disclosure would be made apparent from the drawings and the detailed description of the illustrative embodiments construed in conjunction with the appended claims that follow.

It will be appreciated that features of the present disclosure are susceptible to being combined in various combinations without departing from the scope of the present disclosure as defined by the appended claims.

BRIEF DESCRIPTION OF THE DRAWINGS

The summary above, as well as the following detailed description of illustrative embodiments, is better understood when read in conjunction with the appended drawings. For the purpose of illustrating the present disclosure, exemplary constructions of the disclosure are shown in the drawings. However, the present disclosure is not limited to specific methods and instrumentalities disclosed herein. Moreover, those in the art will understand that the drawings are not to scale. Wherever possible, like elements have been indicated by identical numbers.

Embodiments of the present disclosure will now be described, by way of example only, with reference to the following diagrams wherein.

Figure 1:
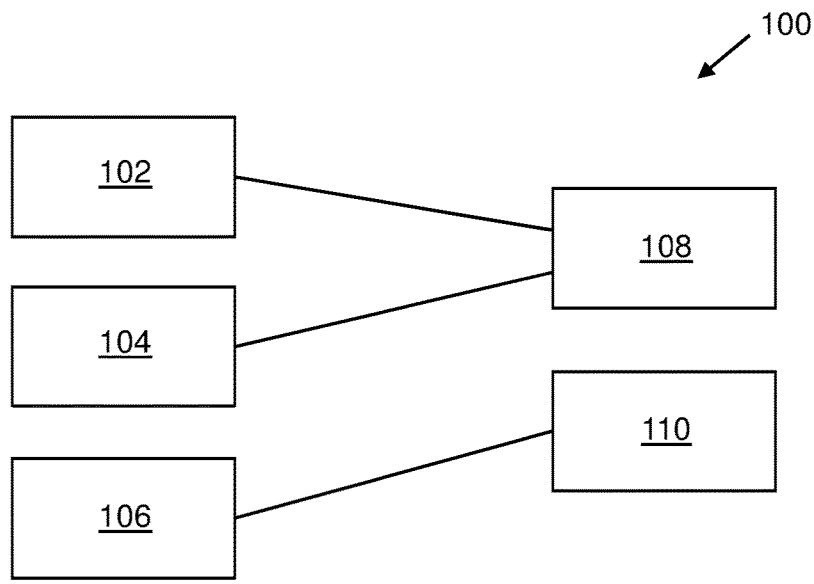
FIGS. 1-2 are block diagrams of exemplary systems for inertial measurement, in accordance with different embodiments of the present disclosure.

In the accompanying drawings, an underlined number is employed to represent an item over which the underlined number is positioned or an item to which the underlined number is adjacent. A non-underlined number relates to an item identified by a line linking the non-underlined number to the item. When a number is non-underlined and accompanied by an associated arrow, the non-underlined number is used to identify a general item at which the arrow is pointing.

DETAILED DESCRIPTION OF EMBODIMENTS

The following detailed description illustrates embodiments of the present disclosure and ways in which they can be implemented. Although some modes of carrying out the present disclosure have been disclosed, those skilled in the art would recognize that other embodiments for carrying out or practicing the present disclosure are also possible.

In one aspect, an embodiment of the present disclosure provides a method for inertial measurement, the method comprising:

(a) controlling at least one imaging sensor to capture at least two consecutive images;

(b) processing the at least two consecutive images to identify at least one feature therein and to determine at least one parameter associated with the at least one feature, wherein the at least one parameter comprises at least one of: a presence or absence of the at least one feature in at least one of the at least two consecutive images, respective pixel locations of the at least one feature in the at least two consecutive images, and/or three-dimensional locations of the at least one feature with respect to the at least one imaging sensor; and (c) determining a change in a position and an orientation of the at least one imaging sensor, based upon the at least one parameter associated with the at least one feature.

In another aspect, an embodiment of the present disclosure provides a system for inertial measurement, the system comprising:

(i) at least one imaging sensor; and (ii) at least one image processing unit coupled to the at least one imaging sensor, wherein the at least one image processing unit is configured to:

(a) control the at least one imaging sensor to capture at least two consecutive images;

(b) process the at least two consecutive images to identify at least one feature therein and to determine at least one parameter associated with the at least one feature, wherein the at least one parameter comprises at least one of: a presence or absence of the at least one feature in at least one of the at least two consecutive images, respective pixel locations of the at least one feature in the at least two consecutive images, and/or three-dimensional locations of the at least one feature with respect to the at least one imaging sensor; and (c) determine a change in a position and an orientation of the at least one imaging sensor, based upon the at least one parameter associated with the at least one feature.

The present disclosure provides a method and a system for inertial measurement. The described method and system utilise processing of at least two consecutive images of operational environment of vehicles for tracking movements of the vehicle, thereby, eliminating need of the heavy and expensive high-performance inertial measurement units. Therefore, payload weight capacity for the vehicles increases. Therefore, the energy consumption for operation of the vehicle, and cost associated with inertial navigation systems is significantly reduced. Further, the described method is robust due to use of simple and low-cost inertial measurement units for estimating accuracy of determined change in position and orientation of the vehicles using the aforementioned image processing.

The system for inertial measurement comprises at least one imaging sensor and at least one image processing unit coupled to the at least one imaging sensor. Further, a method for inertial measurement comprises controlling at least one imaging sensor to capture at least two consecutive images. Specifically, the at least one image processing unit is configured to control the at least one imaging sensor to capture the at least two consecutive images.

In an embodiment, the at least two consecutive images may be images of an operational environment of a vehicle. Specifically, the at least two consecutive images may be two-dimensional images or three-dimensional images. It is to be understood that the vehicle may move within the environment for performing various tasks such as photography, navigation, asset inspection, and the like. In such instance, the at least two consecutive images may constitute an image sequence depicting the environment surrounding the moving vehicle. Therefore, the at least one imaging sensor may be mounted on the vehicle. According to an embodiment of the present disclosure, the at least one imaging sensor may be mounted so as to view (or "see") at least one direction of the environment. Further, at least one of the at least one imaging sensor may be mounted to view a horizon of the environment. For example, four imaging sensors, each with a 90 degrees field of view, may be mounted on the vehicle so as to view 360 degrees (or 4 directions) of the environment.

Examples of such vehicles include, but are not limited to, terrestrial vehicles (such as self-driving cars, human-driven cars, motorcycles, trucks, and so forth), aerial vehicles (such as manned aeroplanes, helicopters, unmanned aerial vehicles, and so forth), and marine vehicles (such as cargo ships, passenger ships, warships, and so forth). Optionally, the vehicle comprises equipment such as a Global Positioning System (GPS) receiver, communication means for communication with a ground control station, accelerometers, and a propulsion system.

According to an embodiment, the method may further comprise determining a time period to be employed for capturing the at least two consecutive images, based upon a velocity and/or an angular velocity of the at least one imaging sensor, wherein the at least two consecutive images are captured within the determined time period from each other. Specifically, the at least one image processing unit may be configured to determine such time period, and the at least one image processing unit may be configured to control the at least one imaging sensor to capture the at least two consecutive images within the determined time period from each other. More specifically, in such embodiment, the determined time period may be inversely dependent on the velocity and/or the angular velocity of the vehicle. The velocity and/or the angular velocity of the at least one imaging sensor may be obtained using any of the accelerometers, the GPS receiver of the vehicle. For example, if velocity of an unmanned aerial vehicle is 40 knots, the determined time period may be 100 milliseconds, whereas, if the velocity of the unmanned aerial vehicle is 20 knots, the determined time period may be 200 milliseconds.

Alternatively, the time period to be employed for capturing the at least two consecutive images may be pre-determined (or fixed), for example 100 milliseconds, 200 milliseconds, 500 milliseconds, and so forth.

In an embodiment, the at least one imaging sensor may relate to equipment that is operable to detect electromagnetic radiation and/or light, to constitute the at least two consecutive images of the environment. According to an embodiment, the at least one imaging sensor may comprise at least one of: a range camera, a digital camera, a black-and-white camera, a Red-Green-Blue (RGB) camera, a hyperspectral imaging camera, a stereo vision camera, a three-dimensional (3D) camera, a Light Detection and Ranging (LiDAR) camera, a time-of-flight (ToF) camera, a focal plane distance imager. Specifically, the at least one imaging sensor may be operable to detect specific wavelengths of electromagnetic radiation and/or intensity of light.

According to an embodiment, the at least one imaging sensor may be arranged in form of an array. Specifically the array of the at least one imaging sensor may be in shape of a rectangle, a circle, a polygon, and so forth. In an embodiment, the at least one imaging sensor may be arranged as a staring array (or staring-plane array, focal-plane array (FPA), focal-plane). Specifically, such staring array arrangement of the at least one imaging sensor may be in form of a rectangular array.

In an embodiment, the at least one imaging sensor may comprise a plurality of photo detectors, each of the plurality of photo detectors having reconfigurable detection windows. Specifically, the detection windows may be reconfigurable to have different durations and/or different starting times, depending on a given use case of the at least one imaging sensor. For example, the plurality of photo detectors are Single Photon Avalanche Diodes (SPADs). According to an embodiment, reconfiguration of the detection windows associated with the plurality of photo detectors may be implemented using at least one technique. Examples of such techniques include round-robin manner reconfiguration, random reconfiguration and so forth.

According to an embodiment of the present disclosure, the at least one imaging sensor may comprise an optical subsystem for focusing electromagnetic radiation onto the plurality of photo detectors. Specifically, the optical subsystem may be configured to reflect the electromagnetic radiation received from a same spatial angle to at least one photo detector of the at least one imaging sensor. More specifically, the optical subsystem may comprise at least one optical element for focusing the electromagnetic radiation. Examples of such optical elements include, but are not limited to lenses, prisms, mirrors, beam splitters, optical waveguides, and so forth.

In one example, the at least one imaging sensor is implemented by way of a pixel sensor comprising a plurality of planar imaging sensors, for example as described in U.S. patent application Ser. No. 14/666,762. In such a case, a planar imaging sensor comprises a plurality of photo detectors, wherein the plurality of photo detectors are divided into at least a first group and a second group, the photo detectors of the first group are configured to have a first detection window, the photo detectors of the second group are configured to have a second detection window, which second detection window is configured to start later in time than the first detection window, and the number of photo detectors in the second group is larger than the number of photo detectors in the first group. In such example, each of the plurality of planar imaging sensors may represent one spatial output pixel. Thus, the number of planar imaging sensors in the pixel sensor corresponds to a number of pixels represented by the pixel sensor. For example, a 4*4 pixel sensor includes 16 planar imaging sensors that are arranged in a 4*4 rectangular array.

It is to be understood that implementation of the at least one imaging sensor by way of the pixel sensor comprising the plurality of planar imaging sensors, may be beneficially used in various instances.

For example, the pixel sensor may be used in an instance wherein the speed of the vehicle is high, the time period for capturing the at least two consecutive images may be less (or short). In such example, the detection windows of the plurality of photo detectors of the planar imaging sensor may be reconfigurable to have durations substantially corresponding to the short time period.

As another example, the pixel sensor may be used in another instance wherein a laser beam is employed to determine distance of an object (such as a building, a bridge, a beacon, a powerline pylon, and so forth in the operational environment) from the vehicle. Specifically, the laser beam may be emitted towards the object using a laser rangefinder, the laser rangefinder being mounted on the vehicle. The distance of the object from the vehicle may be determined as a function of speed of light and time duration between the emission of the laser beam and return of the laser beam to the laser rangefinder, after reflection from the object. Therefore, in such example, the detection windows of the plurality of photo detectors of the planar imaging sensor may be reconfigurable to have durations substantially corresponding to the time duration between the emission and the return of the laser beam. Optionally, the determined distance of the object from the vehicle is utilised for creating a 2.5 dimensional point cloud or a three-dimensional point cloud of the operational environment of the vehicle, wherein the environment comprises the object.

In an embodiment, the at least one image processing unit may relate to hardware, software, firmware, or a combination of these, suitable for operating the at least one imaging sensor for facilitating inertial measurement.

The method for inertial measurement further comprises processing the at least two consecutive images to identify at least one feature therein and to determine at least one parameter associated with the at least one feature. Specifically, the at least one image processing unit is configured to process the at least two consecutive images to identify at least one feature therein and to determine the at least one parameter associated with the at least one feature.

In an embodiment, the processing the at least two consecutive images may comprise employing at least one of Semi-Global Matching (SGM) algorithm, Structure from Motion (SfM) algorithm, and Simultaneous Location and Mapping (SLAM) algorithm. Specifically, at least one of the SGM algorithm, the SfM algorithm, and the SLAM algorithm, may be employed to identify at least one feature in at least one of the at least two consecutive images. More specifically, the at least one feature may relate to (or may depict) objects (such as buildings, bridges, beacons, powerline pylons, and so forth) and/or geographical landforms (such as mountains, valleys, canyons, oceans, islands, and so forth) in the operational environment of the vehicle. In an example, the at least one feature may relate to shape of the objects and/or the geographical landforms.

As described previously, the identified at least one feature is associated with at least one parameter. The at least one parameter comprises at least one of: a presence or absence of the at least one feature in at least one of the at least two consecutive images, respective pixel locations of the at least one feature in the at least two consecutive images, and/or three-dimensional locations of the at least one feature with respect to the at least one imaging sensor. Optionally, the at least one parameter further comprises size of the at least one feature in at least one of the at least two consecutive images. Specifically, the at least one parameter relates to characteristics (or attributes) of the at least one feature in the at least two consecutive images.

It is to be understood that the at least one feature may/may not be present in all the at least two consecutive images. Specifically, due to movement of the vehicle within the operational environment, field of view of the at least one imaging sensor may be constantly changing, thereby, leading to presence or absence of the at least one feature in at least one of the at least two consecutive images. For example, a feature related to a mountain X may be present in one of two consecutive images of a hilly region, whereas the same feature related to the mountain X may be absent in another of the two consecutive images. In such example, the vehicle may have moved past the mountain X such that the mountain X was no longer in field of view of the at least one imaging sensor.

It is also to be understood that the respective pixel locations of the at least one feature may not be same in the at least two consecutive images. In an embodiment, the term "pixel locations" used herein relates to two-dimensional pixel coordinates of the at least one feature in the at least two consecutive images. For example, pixel location of a feature depicting an island may be (5, 7) in one of two consecutive images of an oceanic environment, whereas pixel location of the same feature in another of the two consecutive images may be (12, 6).

It is also to be understood that the three-dimensional locations of the at least one feature with respect to the at least one imaging sensor may not be same in the at least two consecutive images. Specifically, the three-dimensional locations of the at least one feature with respect to the at least one imaging sensor may be obtained using the at least two consecutive images captured by imaging sensors that provide depth information, such as the range camera, the three-dimensional (3D) camera, the LiDAR camera, the time-of-flight camera, the focal plane distance imager. For example, three-dimensional location of a feature depicting a bridge, with respect to the at least one imaging sensor, may be (1, 2, 7) according to one of two consecutive images of a terrestrial environment, whereas three-dimensional location of the same feature according to another of the two consecutive images may be (2, 3, 6) with respect to the at least one imaging sensor.

In an instance when the at least two consecutive images are two-dimensional images, the at least one parameter (associated with the identified at least one feature in the at least two consecutive images) comprises at least one of: the presence or absence of the at least one feature in at least one of the at least two consecutive images, respective pixel locations of the at least one feature in the at least two consecutive images.

Similarly, in another instance when the at least two consecutive images are three-dimensional images, the at least one parameter (associated with the identified at least one feature in the at least two consecutive images) comprises at least one of: the presence or absence of the at least one feature in at least one of the at least two consecutive images, three-dimensional locations of the at least one feature with respect to the at least one imaging sensor.

The method for inertial measurement further comprises determining a change in a position and an orientation of the at least one imaging sensor, based upon the at least one parameter associated with the at least one feature. Specifically, the at least one parameter may be indicative of position and orientation of the at least one imaging sensor having the at least one imaging sensor mounted thereon, at the time of capturing the at least two consecutive images. More specifically, the at least two consecutive images may be captured from different fields of view of the at least one imaging sensor, wherein the field of view is indicative of the position and the orientation of the at least one imaging sensor. Therefore, using deviation and/or similarity between the at least one parameter (specifically, attributes/values thereof) associated with the at least one feature within the captured at least two consecutive images, the at least one image processing unit is operable to perform the inertial measurement function like that of conventional inertial measurement units used in vehicles.

For example, in the aforementioned example wherein the pixel locations of the feature depicting the island in two consecutive images is (5, 7) and (12, 6), based on the pixel locations parameter, a change in orientation of the at least one imaging sensor may be determined. For example, in the given example, the orientation of the at least one imaging sensor may have changed from a straight direction towards a left direction in between capture of the two consecutive images.

In an embodiment, the at least two consecutive images are time-stamped, and wherein the change in the position and the orientation of the at least one imaging sensor is determined as a function of time. Specifically, the at least one image processing unit may be configured to time stamp the at least two consecutive images. According to an embodiment, the time-stamp may comprise at least time of capture of the at least two consecutive images. For example, time stamps of three consecutive images may be 13:02:00 hrs, 13:02:01 hrs, and 13:02:02 hrs. Further, the time stamps of the at least two consecutive images, are indicative of the change in the position and the orientation of the at least one imaging sensor as the function of time. Furthermore, such function of time may relate to a trajectory of the vehicle within the operational environment.

According to an embodiment, the method may further comprise estimating an accuracy of the determined change in the position and the orientation of the at least one imaging sensor. Specifically, the at least one image processing unit is configured to estimate an accuracy of the determined change in the position and the orientation. In one embodiment, the estimated accuracy of a determined measurement (the determined change in position or the determined change in orientation) may be expressed as variance of the determined measurement. Specifically, the estimated accuracy of the determined change in position may be represented as variance thereof. Similarly, the estimated accuracy of the determined change in orientation may be represented as variance thereof. In another embodiment, the estimated accuracy of the determined measurements may be expressed as a covariance matrix of both the determined change in the position and the orientation.

It is to be understood that the accuracy of the determined change in the position and the orientation of the at least one imaging sensor may be high when the captured and processed at least two consecutive images are three dimensional. Specifically, in such instance, even a few number of identified features within the at least two consecutive images may accurately determine the change in the position and the orientation of the at least one imaging sensor.

According to another embodiment of the present disclosure, the estimating the accuracy may comprise employing an inertial measurement unit to collect measurement data; and comparing the determined change in the position and the orientation of the at least one imaging sensor with the measurement data collected by the inertial measurement unit. Specifically, the inertial measurement unit is a device (or equipment) that may be employed to collect measurement data pertaining to angular motion (such as angular velocity, angular acceleration, and so forth) and linear motion (such as linear velocity) of the vehicle. For example, the employed inertial measurement unit may be a simple and low-cost inertial measurement unit. Optionally, the measurement data also comprises magnetic field around the vehicle. In such embodiment, the at least one image processing unit may be configured to compare the determined change in the position and the orientation with the measurement data. For example, the accuracy may be estimated as 'Very High' if the determined change in the position and the orientation of the at least one imaging sensor is almost same as the measurement data collected by the inertial measurement unit. Similarly, the accuracy may be estimated as 'Low' if the determined change in the position and the orientation of the at least one imaging sensor differs significantly from the measurement data collected by the inertial measurement unit.

In an embodiment, the measurement data collected from the inertial measurement unit may be utilized for determining the time period to be employed for capturing the at least two consecutive images.

In one embodiment, the determined change in the position and the orientation of the at least one imaging sensor may be combined with the measurement data collected by the inertial measurement unit. Specifically, the combined result may have higher accuracy as compared to either of the determined change in the position and the orientation of the at least one imaging sensor and the measurement data collected by the inertial measurement unit.

Optionally, the determined change in the position and the orientation of the at least one imaging sensor, and the estimated accuracy thereof, are stored at a database coupled to the inertial measurement unit. Further, the inertial measurement unit may be configured to determine a best estimate of the determined change in the position and the orientation of the at least one imaging sensor by employing techniques such as Kalman filtering, Extended Kalman filtering, particle filtering, alpha-beta filtering, and so forth.

In an embodiment, the inertial measurement unit may be a micro-electro-mechanical-system-based inertial measurement unit. Specifically, the micro-electro-mechanical-system-based inertial measurement unit may have small size, thereby requiring less space for mounting thereof, on the vehicle. Beneficially, the micro-electro-mechanical-system-based inertial measurement unit may have low weight due to compact design thereof. Therefore, micro-electro-mechanical-system-based inertial measurement unit may require less energy for operation thereof.

According to an embodiment, the at least one image processing unit may be coupled to a vehicle control system of a vehicle, the determined change in the position and the orientation of the at least one imaging sensor being indicative of a change in a position and an orientation of the vehicle, wherein the at least one image processing unit is configured to communicate the determined change in the position and the orientation of the at least one imaging sensor to the vehicle control system, so as to enable the vehicle control system to control the vehicle. Specifically, the vehicle control system may be hardware, software, firmware, or a combination of these, operable to control the vehicle. For example, the vehicle control system may include a memory unit and a processor to control the vehicle. More specifically, the controlling the vehicle may comprise at least one of maneuvering the vehicle within the operational environment, and executing tasks depending on the position and/or the orientation of the vehicle. Therefore, the vehicle control system may control the vehicle, based on the communicated determined change in the position and the orientation of the at least one imaging sensor.

In an example, a detected change in position and orientation of at least one imaging sensor of a drone D may indicate that the drone D is at periphery of enemy territory. Therefore, when such determined change in the position and the orientation is communicated by at least one image processing unit to a vehicle control system associated with the drone D, the vehicle control system may control the drone D by maneuvering the drone D to move away from the periphery of the enemy territory.

In another example, a detected change in position and orientation of at least one imaging sensor of an unmanned aerial vehicle U may indicate that the unmanned aerial vehicle U is facing a front side of a residential complex. Therefore, when such determined change in the position and the orientation is communicated by at least one image processing unit to a vehicle control system associated with the unmanned aerial vehicle U, the vehicle control system may control the unmanned aerial vehicle U by executing asset inspection tasks such as high-definition aerial imaging of the residential complex.

DETAILED DESCRIPTION OF THE DRAWINGS

Referring to FIG. 1, illustrated is a block diagram of an exemplary system 100 for inertial measurement, in accordance with an embodiment of the present disclosure. As shown, the system 100 includes at least one imaging sensor, depicted as imaging sensors 102, 104, and 106, and at least one image processing unit, depicted as image processing units 108 and 110. In the system 100, the at least one image processing unit is coupled to the at least one imaging sensor. Specifically, the image processing unit 108 is coupled to the imaging sensors 102 and 104, and the image processing unit 110 is coupled to the imaging sensor 106.

Figure 2:
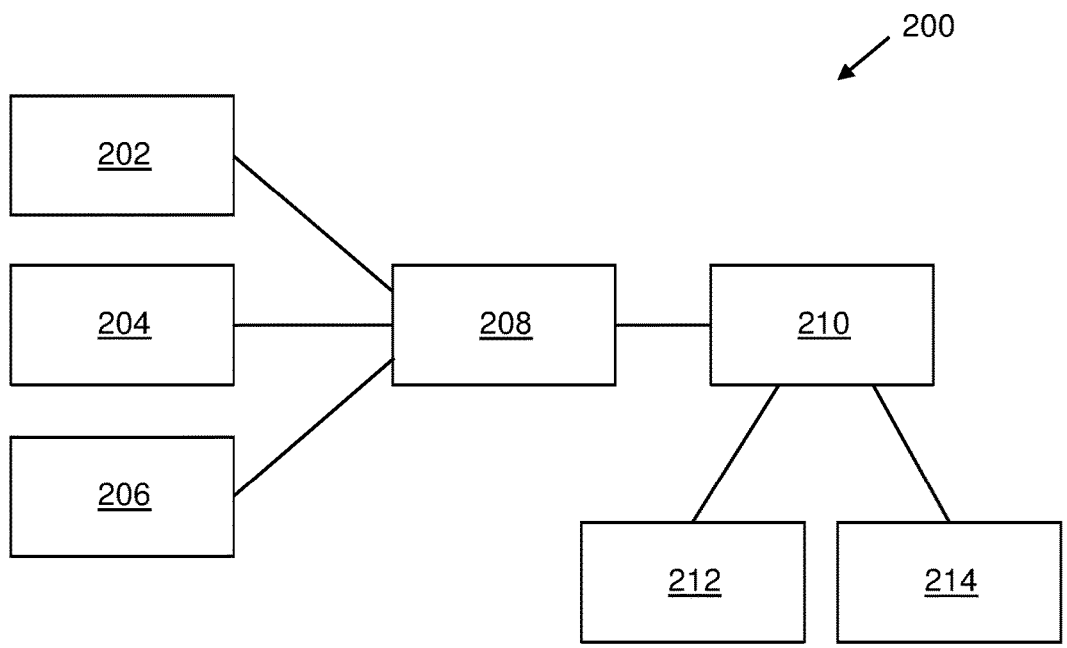

Referring to FIG. 2, illustrated is a block diagram of an exemplary system 200 for inertial measurement, in accordance with another embodiment of the present disclosure. As shown, the system 200 includes at least one imaging sensor, depicted as imaging sensors 202, 204, and 206, at least one image processing unit, depicted as image processing unit 208, and a vehicle control system 210 of a vehicle (not shown). The image processing unit 208 is coupled to the at least one imaging sensors 202, 204, and 206. Further, in the system 200, the image processing unit 208 is coupled to the vehicle control system 210 to communicate a determined change in position and orientation of the at least one imaging sensors 202, 204, and 206, to the vehicle control system 210, so as to enable the vehicle control system 210 to control the vehicle. Further, the system 200 includes an inertial measurement unit 212 for collecting measurement data, the inertial measurement unit 212 being coupled to the vehicle control system 210. Further, the system 200 includes a global positioning system 214 to monitor a position of the vehicle.

Figure 3:
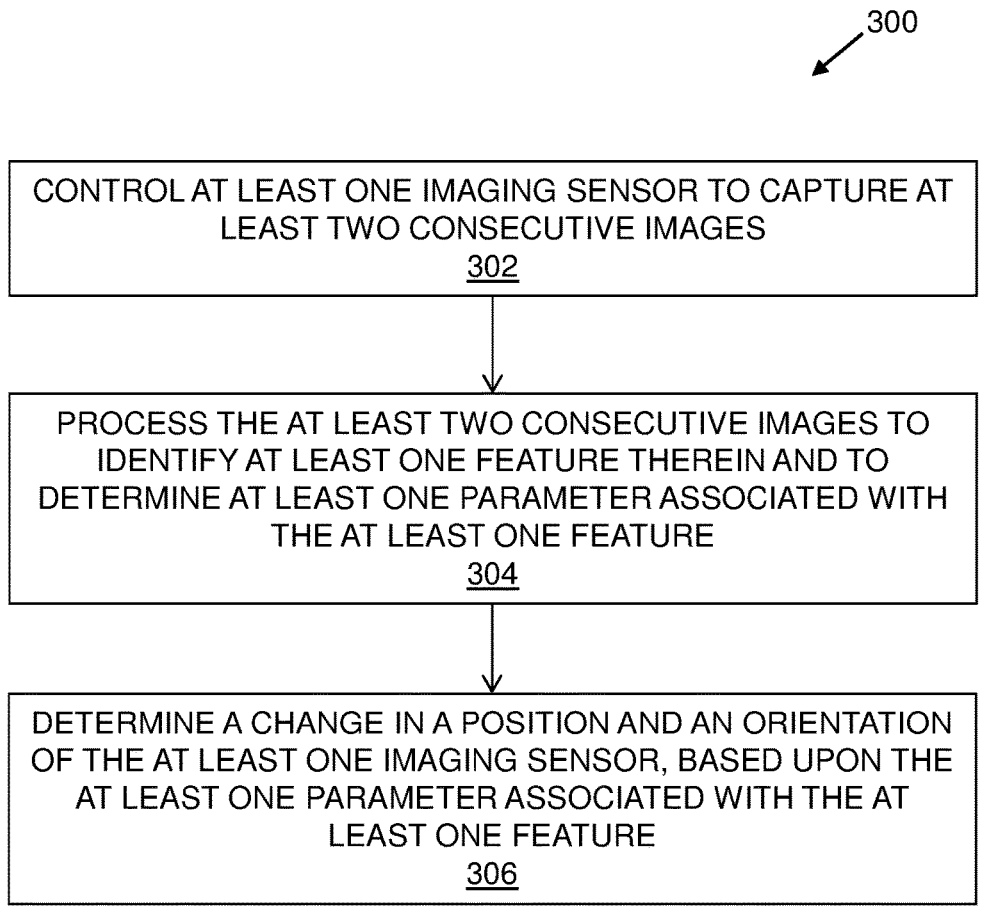
FIG. 3 illustrates steps of a method for inertial measurement, in accordance with an embodiment of the present disclosure.

Referring to FIG. 3 illustrated are steps of a method 300 for inertial measurement, in accordance with an embodiment of the present disclosure. At step 302, at least one imaging sensor is controlled to capture at least two consecutive images. At step 304, the at least two consecutive images are processed to identify at least one feature therein and to determine at least one parameter associated with the at least one feature. The at least one parameter comprises at least one of: a presence or absence of the at least one feature in at least one of the at least two consecutive images, respective pixel locations of the at least one feature in the at least two consecutive images, and/or three-dimensional locations of the at least one feature with respect to the at least one imaging sensor. At step 306, a change in a position and an orientation of the at least one imaging sensor is determined, based upon the at least one parameter associated with the at least one feature.

The steps 302 to 306 are only illustrative and other alternatives can also be provided where one or more steps are added, one or more steps are removed, or one or more steps are provided in a different sequence without departing from the scope of the claims herein. For example, the method 300 may further comprise estimating an accuracy of the determined change in the position and the orientation of the at least one imaging sensor. In one example, the method 300 may further comprise determining a time period to be employed for capturing the at least two consecutive images, based upon a velocity and/or an angular velocity of the at least one imaging sensor, wherein the at least two consecutive images are captured within the determined time period from each other. Optionally, in the method 300, the estimating the accuracy may comprise employing an inertial measurement unit to collect measurement data; and comparing the determined change in the position and the orientation of the at least one imaging sensor with the measurement data collected by the inertial measurement unit. In an example, in the method 300, the inertial measurement unit may be a micro-electro-mechanical-system-based inertial measurement unit. Optionally, in the method 300, the at least two consecutive images may be time-stamped, and wherein the change in the position and the orientation of the at least one imaging sensor is determined as a function of time. In an example, in the method 300, the at least one imaging sensor comprises at least one of: a range camera, a digital camera, a black-and-white camera, a Red-Green-Blue (RGB) camera, a hyperspectral imaging camera, a stereo vision camera, a three-dimensional (3D) camera, a Light Detection and Ranging (LiDAR) camera, a time-of-flight (ToF) camera, a focal plane distance imager.

Modifications to embodiments of the present disclosure described in the foregoing are possible without departing from the scope of the present disclosure as defined by the accompanying claims. Expressions such as "including", "comprising", "incorporating", "have", "is" used to describe and claim the present disclosure are intended to be construed in a non-exclusive manner, namely allowing for items, components or elements not explicitly described also to be present. Reference to the singular is also to be construed to relate to the plural.

The invention claimed is:

1. A method for inertial measurement, the method comprising:
    (a) controlling at least one imaging sensor to capture at least two consecutive images;
    (b) processing the at least two consecutive images to identify at least one feature therein and to determine at least one parameter associated with the at least one feature, wherein the at least one parameter comprises at least one of: a presence or absence of the at least one feature in at least one of the at least two consecutive images, respective pixel locations of the at least one feature in the at least two consecutive images, and/or three-dimensional locations of the at least one feature with respect to the at least one imaging sensor; and
    (c) determining a change in a position and an orientation of the at least one imaging sensor, based upon the at least one parameter associated with the at least one feature.

2. A method of claim 1, further comprising determining a time period to be employed for capturing the at least two consecutive images, based upon a velocity and/or an angular velocity of the at least one imaging sensor, wherein the at least two consecutive images are captured within the determined time period from each other.

3. A method of claim 1, further comprising estimating an accuracy of the determined change in the position and the orientation of the at least one imaging sensor.

4. A method of claim 3, wherein the estimating the accuracy comprises employing an inertial measurement unit to collect measurement data; and comparing the determined change in the position and the orientation of the at least one imaging sensor with the measurement data collected by the inertial measurement unit.

5. A method of claim 4, wherein the inertial measurement unit is a micro-electro-mechanical-system-based inertial measurement unit.

6. A method of claim 1, wherein the at least two consecutive images are time-stamped, and wherein the change in the position and the orientation of the at least one imaging sensor is determined as a function of time.

7. A method of claim 1, wherein the at least one imaging sensor comprises at least one of: a range camera, a digital camera, a black-and-white camera, a Red-Green-Blue (RGB) camera, a hyperspectral imaging camera, a stereo vision camera, a three-dimensional (3D) camera, a Light Detection and Ranging (LiDAR) camera, a time-of-flight (ToF) camera, a focal plane distance imager.

8. A system for inertial measurement, the system comprising:
    at least one imaging sensor; and
    (ii) at least one image processing unit coupled to the at least one imaging sensor, wherein the at least one image processing unit is configured to:

(a) control the at least one imaging sensor to capture at least two consecutive images;

(b) process the at least two consecutive images to identify at least one feature therein and to determine at least one parameter associated with the at least one feature, wherein the at least one parameter comprises at least one of: a presence or absence of the at least one feature in at least one of the at least two consecutive images, respective pixel locations of the at least one feature in the at least two consecutive images, and/or three-dimensional locations of the at least one feature with respect to the at least one imaging sensor; and (c) determine a change in a position and an orientation of the at least one imaging sensor, based upon the at least one parameter associated with the at least one feature.

9. A system of claim 8, wherein the at least one image processing unit is configured to determine a time period to be employed for capturing the at least two consecutive images, based upon a velocity and/or an angular velocity of the at least one imaging sensor, and wherein the at least one image processing unit is configured to control the at least one imaging sensor to capture the at least two consecutive images within the determined time period from each other.

10. A system of claim 8, wherein the at least one image processing unit is configured to estimate an accuracy of the determined change in the position and the orientation of the at least one imaging sensor.

11. A system of claim 10, wherein the system further comprises an inertial measurement unit for collecting measurement data, and wherein, when estimating the accuracy, the at least one image processing unit is configured to compare the determined change in the position and the orientation of the at least one imaging sensor with the measurement data collected by the inertial measurement unit.

12. A system of claim 11, wherein the inertial measurement unit is a micro-electro-mechanical-system-based inertial measurement unit.

13. A system of claim 8, wherein the at least one image processing unit is configured to time stamp the at least two consecutive images, wherein the change in the position and the orientation of the at least one imaging sensor is determined as a function of time.

14. A system of claim 8, wherein the at least one imaging sensor comprises at least one of: a range camera, a digital camera, a black-and-white camera, a Red-Green-Blue (RGB) camera, a hyperspectral imaging camera, a stereo vision camera, a three-dimensional (3D) camera, a Light Detection and Ranging (LiDAR) camera, a time-of-flight (ToF) camera, a focal plane distance imager.

15. A system of claim 8, wherein the at least one imaging sensor comprises a plurality of photo detectors, each of the plurality of photo detectors having reconfigurable detection windows.

16. A system of claim 15, wherein the at least one imaging sensor comprises an optical subsystem for focusing electromagnetic radiation onto the plurality of photo detectors.

17. A system of claim 8, wherein the at least one image processing unit is coupled to a vehicle control system of a vehicle, the determined change in the position and the orientation of the at least one imaging sensor being indicative of a change in a position and an orientation of the vehicle, wherein the at least one image processing unit is configured to communicate the determined change in the position and the orientation of the at least one imaging sensor to the vehicle control system, so as to enable the vehicle control system to control the vehicle.

* * * * *